United States Patent
Raman et al.

(10) Patent No.: US 6,424,170 B1
(45) Date of Patent: Jul. 23, 2002

(54) APPARATUS AND METHOD FOR LINEAR ON-DIE TERMINATION IN AN OPEN DRAIN BUS ARCHITECTURE SYSTEM

(75) Inventors: Raghu P. Raman; Songmin Kim, both of Beaverton; Chee How Lim; Usman A. Mughal, both of Hillsboro, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/860,363

(22) Filed: May 18, 2001

(51) Int. Cl.[7] .............................. H03K 17/16
(52) U.S. Cl. ............................ 326/30; 326/58
(58) Field of Search ....................... 326/30, 57, 58, 326/83, 86

(56) References Cited

U.S. PATENT DOCUMENTS

| | | | |
|---|---|---|---|
| 4,859,877 A | * | 8/1989 | Cooperman et al. ........ 307/443 |
| 5,528,168 A | | 6/1996 | Kleveland |
| 5,781,028 A | | 7/1998 | Decuir |
| 5,793,223 A | | 8/1998 | Frankeny |
| 6,026,456 A | | 2/2000 | Ilkbahar |
| 6,127,840 A | | 10/2000 | Coteus et al. |
| 6,222,389 B1 | * | 4/2001 | Williams ...................... 326/86 |

* cited by examiner

Primary Examiner—Michael Tokar
Assistant Examiner—Daniel D. Chang
(74) Attorney, Agent, or Firm—Blakely, Sokoloff, Taylor & Zafman LLP

(57) ABSTRACT

A pull-up circuit has substantially linear current-voltage (I–V) characteristics for use in a bus system, such as in an open drain bus architecture type system. Operation in the linear region of the I–V characteristics is useful in high frequency input/output circuits. The pull-up circuit includes a transistor and a single termination resistor coupled to the transistor, and is simpler than other types of pull-up circuits. This simplicity in design saves area on a chip. The termination resistor in the pull-up circuit can be an n-well resistor formed on the same chip as the transistor, thereby further contributing to the savings in chip area.

20 Claims, 2 Drawing Sheets

APPARATUS AND METHOD FOR LINEAR ON-DIE TERMINATION IN AN OPEN DRAIN BUS ARCHITECTURE SYSTEM

TECHNICAL FIELD

This disclosure relates generally to electronic devices, and in particular but not exclusively, relates to circuitry that provides linear on-die termination for a bus, such as a bus in an open-drain bus architecture system.

BACKGROUND

Operating frequencies of processors are progressively increasing. In order to take advantage of these high frequencies, computer systems attempt to transmit signals along their buses and between system components at comparable frequencies. The need for transmitting and receiving data between two system components (typically semiconductor components) at higher frequencies necessitates the design of faster input/output (I/O) circuits.

However, high-speed I/O circuits are often complex circuits. The complexity is partly due to the fact that such I/O circuits need to account for drive strength and degrading signal quality at high frequencies. Furthermore, the various components of these I/O circuits often have non-linear current-voltage (I–V) characteristics, which make prediction of drive strength difficult in noisy environments, and thus necessitate complex designs for these I/O circuits in order to compensate for the non-linear I–V characteristics. The complexity in design causes increased consumption of real estate on an integrated chip, which translates directly into increased manufacturing costs and increased time-to-market for the particular product.

Proper termination is also an issue with these high-speed I/O circuits. When transmitting and receiving data at high frequencies between system components, some problems are encountered. Buses behave like transmission lines, where impedance mismatches lead to signal reflection and interference effects, such as ring-backs and overshoots. Maintaining signal quality over interconnections thus typically require termination of the transmission lines (e.g., buses) with matching impedances to minimize signal reflections.

With what is sometimes referred to as "dual-ended termination," transmission lines used to carry signals in both directions are terminated at both ends (e.g., at agents at each end), such that a terminating resistor matches a characteristic impedance of the transmission line. However, having the termination resistor at the driving end of the transmission line needlessly dissipates power, particularly when a low voltage level (e.g., a binary 0) is driven onto the transmission line, since a current flows through the termination resistor at that driving end. Attempts to avoid this power dissipation include system architectures that provide a termination resistor on only one side of the transmission line (sometimes referred to as "single-ended termination"), but such single-ended termination architectures result in a positive reflection coefficient at the un-terminated end of the transmission line, which is an adverse result for a high-performance and high frequency bus. Furthermore, the various configurations that are currently used to provide the terminating resistor(s) also suffer from complexity and waste of valuable real estate on the chip.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus and method for linear on-die termination, such as in an open drain bus architecture (ODBA) system, are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention provides substantially linear I–V pull-up characteristics for components in a bus system, such as an ODBA system, while minimizing costs, minimizing area consumption on a chip, and preserving signal quality. In one embodiment, a switching element in combination with a termination impedance element (both formed on the same chip or die) enables operation in the linear range of the I–V characteristics (e.g., biases the switching element to a substantially linear I–V characteristic operating region). An embodiment of the invention also provides a way to dynamically couple and decouple the termination impedance element to a bus. When a device is receiving data from the bus or is transmitting high signal levels (e.g., binary 1s), the termination impedance element is coupled to the bus. When the device is transmitting low signal levels (e.g., binary 0s) the termination impedance element is de-coupled from the bus. This dynamic termination reduces power dissipation and also improves receiver noise margin.

Figure 1:
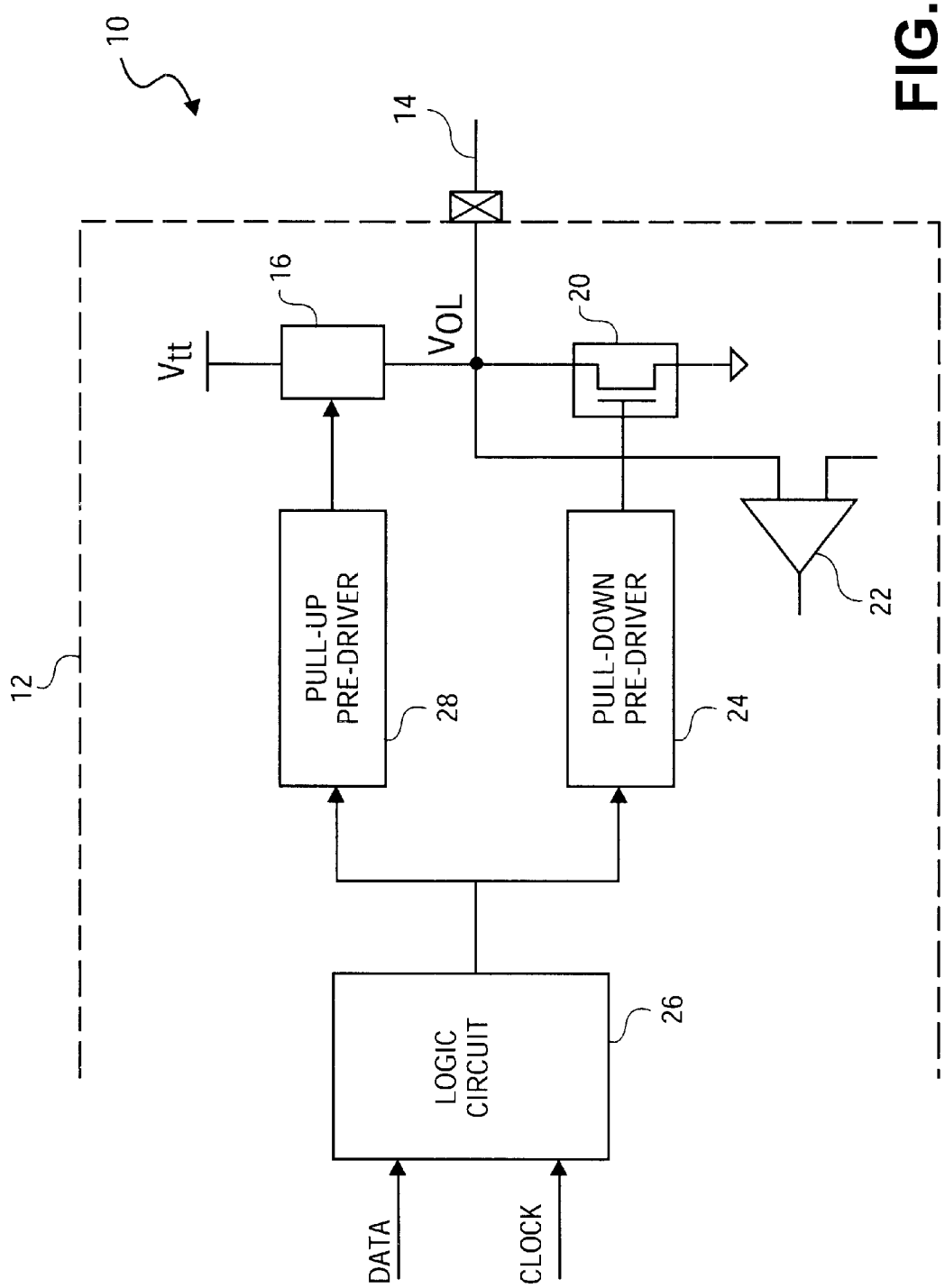
FIG. 1 is a block diagram of a system that can implement an embodiment of the invention.

Referring first to FIG. 1, shown generally at 10 is a system that can implement an embodiment of the invention. The system 10 includes a device 12 that can communicate with another device (not shown) via one or more buses 14. Examples of the device 12 can include chipsets, die(s), input/output (I/O) buffers, network cards, processors, and the like.

In an embodiment, the system 10 can have an architecture such as an open drain bus architecture (ODBA) or other ODBA-based architecture. The bus 14 can be, for example in one embodiment, a Gunning Transceiver Logic (GTL) bus, a GTL+ bus, or other GTL-type bus, and it is understood that another embodiment of the invention may be implemented with other types of buses.

In the example shown in FIG. 1, the device 12 includes a pull-up circuit 16, which in turn can include a single termination impedance element (as will be described later below). The pull-up circuit 16 is coupleable between a voltage source $V_{tt}$ and a node (e.g., at a pad 18) having an output-low voltage $V_{OL}$. The pad 18 is coupled to the bus 14.

The device 12 includes a pull-down transistor 20 having a drain terminal coupled to the pad 18 and a source terminal coupled to ground. According to one embodiment, the transistor 20 can comprise an N-channel metal oxide semiconductor (NMOS) transistor or similar transistor. The device 12 further includes a receiver 22 to detect signals on the bus 14 and which may comprise a comparator or amplifier. The transistor 20, its associated driver, and the receiver 22 together can form parts of devices such as processors, chipset logic to communicate between processors and the rest of the system 10, cluster logic to communicate between clusters of processors, I/O buffer circuitry, and the like.

In accordance with one embodiment of the invention, the device 12 includes a pull-down pre-driver (or driver) circuit 24 coupled to a gate terminal of the transistor 20. The pre-driver circuit 24 receives its input(s) from output(s) of a logic circuit 26. The logic circuit 26 can comprise sequential and combinational logic, such as those that are known in the art for ODBA systems, having a data signal and a clock signal as inputs. In one embodiment, the pre-driver circuit 24 includes an inverter having an output coupled to the gate terminal of the transistor 20. Thus, for example for a transmit mode of operation, low signal levels (e.g., binary 0s) of the data signal are converted by the inverter of the pre-driver circuit 24 into high signal levels (e.g., binary 1s) that turn on the transistor 20. The turning on of the transistor 20 "pulls down" the pad 18 to a low voltage level. In contrast, high signal levels (e.g., binary 1s) of the data signal are converted by the inverter of the pre-driver circuit 24 into low signal levels (e.g., binary 0s) that turn off the transistor 20, resulting in a "pull up" of the pad 18 to a high voltage level via the pull-up circuit 16 and the voltage source $V_{tt}$.

In an embodiment of the invention, the device 12 includes a pull-up pre-driver circuit 28 to dynamically "turn on" or "turn off" the termination impedance element in the pull-up circuit 16. That is, when the device 12 is transmitting low-level voltages (e.g., binary 0s) on the bus 14, the termination impedance element is turned off or de-coupled by the pre-driver circuit 28. As a result, the termination impedance element does not draw current and dissipate power while low voltage/signal levels are driven on to the bus 14 at the pad 18. Thus, power is saved in the transmit mode of operation, when the termination impedance element is not needed for driving a low voltage levels.

In an embodiment, the pull-up pre-driver circuit 28 turns on or couples the termination impedance element to the pad 18, when the device 12 drives or transmits high-level voltages (e.g., binary 1s) on the bus 14 at the pad 18. This allows current to flow through the termination impedance element and pulls the pad 18 to a high voltage state, since the transistor 20 is turned off at this time. The pre-driver circuit 28 can thereafter keep the termination impedance element turned on if no low voltage levels are subsequently transmitted. If the device 12 is receiving data or an external signal via the bus 14 from another device, the pre-driver circuit 28 can turn on the termination impedance element to provide a matching termination impedance. Turning on the termination impedance element thus provides matching termination that suppresses overshoots and residual noises on the bus 14, and also improves signal quality, timing, and device reliability.

Figure 2:
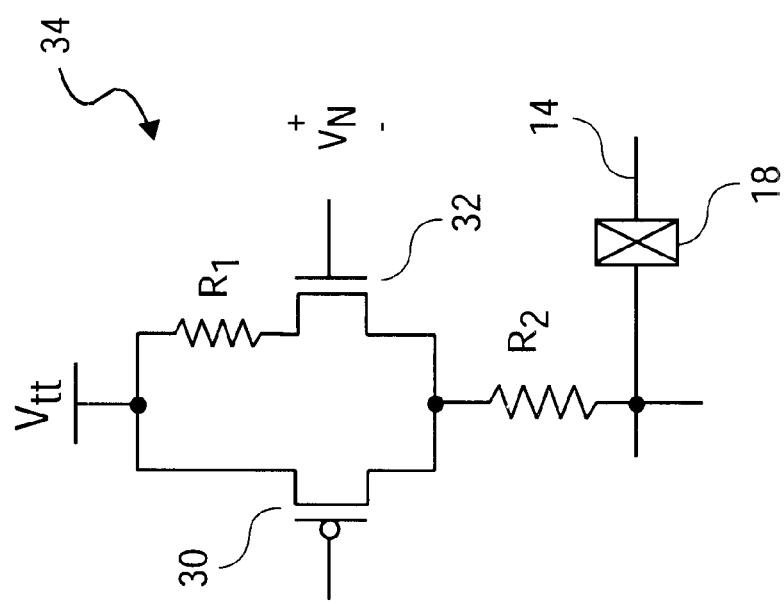
FIG. 2 is a schematic diagram of an example pull-up circuit that can be used in the system of FIG. 1.

FIG. 2 is a schematic diagram of an example of a pull-up circuit 34 that can be used in the system 10 of FIG. 1. The example of the pull-up circuit 34 shown in FIG. 2 includes a P-channel metal oxide semiconductor (PMOS) transistor 30 in parallel with an NMOS transistor 32 in combination with resistors $R_1$ and $R_2$. The resistor $R_1$ is used to protect the NMOS transistor 32 from electrostatic discharge (ESD), while the resistor $R_2$ (along with the combined impedance of the other components of the pull-up circuit 34) is used for impedance matching with a characteristic impedance of the bus 14.

In operation, when a threshold voltage $V_N$ is reached, the NMOS transistor 32 turns off (e.g., becomes an open circuit), while the PMOS transistor 30 turns on (e.g., becomes a short circuit). When this occurs, such as when driving a high voltage at the pad 18 (e.g., when spending a binary 1), the PMOS transistor 30 is coupled in series with the resistor $R_2$ to pull the voltage at the pad 18 to a high level, while the NMOS transistor 32 and the resistor $R_1$ are de-coupled from the circuit.

The example of the pull-up circuit 34 shown in FIG. 2 has a heavy chip area penalty because the two resistors $R_1$ and $R_2$ are used. Moreover, when the voltage $V_N = V_{tt} - V_t$ (where $V_t$ is the turn-on voltage of the NMOS transistor 32) develops across the NMOS transistor 32 to turn it off, the NMOS transistor 32 becomes redundant. The PMOS transistor 30, by itself, has non-linear I–V characteristics. As faster I/O buffers are designed, the non-linear I–V characteristics of the PMOS transistor 30 in combination with the high chip area usage of the resistors $R_1$ and $R_2$ and the NMOS transistor 32 make the example pull-up circuit 34 of FIG. 2 unsuitable.

Figure 3:
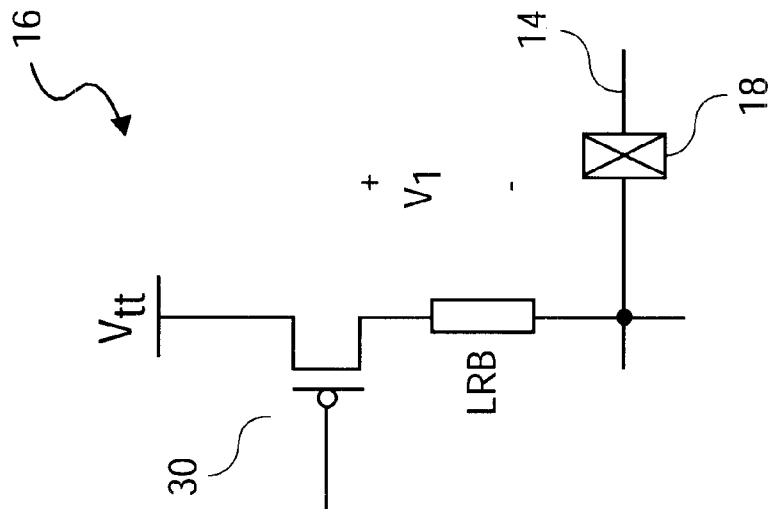
FIG. 3 is a schematic diagram of a pull-up circuit that can be used in the system of FIG. 1 according to an embodiment of the invention.

FIG. 3 is a schematic diagram of the pull-up circuit 16 that can be used in the system 10 of FIG. 1 in accordance with an embodiment of the invention. As will be described below, the pull-up circuit 16 of FIG. 3 provides a well-suited pull-up solution for the system 10 and demonstrates substantially linear I–V characteristics. The pull-up circuit 16 also provides an impedance that substantially matches the characteristic impedance of the bus 14. These factors make the pull-up circuit 34 useful for high-frequency I/O buffer design.

An embodiment of the pull-up circuit 16 includes a single termination impedance element comprising a linearizing resistive block LRB. The LRB has a first terminal coupled to a node of the bus 14 at the pad 18, and has a second terminal. A switching element comprising the PMOS transistor 30 has a source terminal coupleable to the voltage source $V_{tt}$ and has a drain terminal coupled to only the second terminal of the LRB. That is, unlike the pull-up circuit 34 of FIG. 2, the embodiment of the pull-up circuit 16 in FIG. 3 eliminates the NMOS resistor 32 and the second resistor.

The pull-up circuit 16 can also provide dynamic on-die termination. That is, the PMOS transistor 30 has a gate terminal to receive a signal from the pull-up pre-driver circuit 28. The signal switches the PMOS transistor 30 on to couple the LRB between the voltage source $V_{tt}$ and the node at the pad 18, if a voltage at the node is at a first level (e.g., when the device 12 is driving a binary 1 on the bus 14). The signal switches the PMOS transistor 30 off to de-couple the LRB between the voltage source $V_{tt}$ and the node at the pad 18, if the voltage at the node is at a second level lower than the first level (e.g., the device 12 is driving a binary 0 on the bus 14).

As seen in FIG. 3, the embodiment of the pull-up circuit 16 is considerably simpler than the pull-up circuit 34 of FIG.

2, since the pull-up circuit 16 uses fewer components. This simplicity in design reduces the area consumption on the die, and also results in faster time-to-market for the product.

The pull-up circuit 16 operates in a substantially linear region of the I–V characteristics. More specifically, the LRB biases the PMOS transistor 30 to a substantially linear I–V characteristic operating region. The LRB produces a voltage $V_1$ across it. This voltage drop moves the operating region of the PMOS transistor 30 to $V_{DS}=V_{tt}-V_1-V_{pad}$ and helps ensure that the PMOS transistor 30 remains biased in the linear region ($V_{DS}<V_{GS}-V_t=V_{tt}-V_t$), where the PMOS transistor 30 behaves like a resistor. Otherwise, the PMOS transistor 30 may operate in a saturation region where it has a very large output impedance. Instead, in an embodiment of the invention, operation in the linear region of the I–V characteristics is due at least in part to a reduction in the source-to-drain voltage $V_{DS}$ of the PMOS transistor 30. Stated in another way, the resistance of the LRB is larger than a resistance of the PMOS transistor 30. This causes the LRB to dominate and shifts the operating region of the PMOS transistor 30 to the linear portion of the I–V characteristics.

Operation in a linear I–V characteristic region is useful because in a binary-weighted or thermometer-weighted pull-down coding scheme, a linear I–V characteristic provides more predictable drive strength, especially in noisy environments. Thus, when the pull-up or pull-down strength is decreased/increased, the resulting drive strength can be better determined based on the substantially linear I–V characteristic operating region. Furthermore, since degrading signal quality is also of concern in high-speed I/O design, the linear I–V provides a more predictable and matched termination for the bus 14, which helps to preserve signal quality.

In an embodiment, the resistance value of the LRB alone can be used to determine a substantial match with the characteristic impedance of the bus 14. Closer matching can be obtained by further considering an impedance of the PMOS transistor 30 in combination with the resistance value of the LRB. As an example, a resistance (or impedance) of the pull-up circuit 16 as a function of an operating voltage can exhibit a nearly constant resistance (e.g., between 0.50 k Ohms and 0.54 k Ohms) and is monotonic. In contrast, a resistance of the pull-up circuit 34 of FIG. 2 is non-monotonic and non-linear (e.g., between 0.38 k Ohms and 0.55 k Ohms, for example).

In an embodiment, the LRB and the PMOS transistor 30 can be formed on the same die. Forming these two elements on the same die reduces complexity and chip area usage, which is in contrast to other implementations where discrete resistors are mounted on or coupled to the die, for instance. Chip area may also be significantly wasted in some on-die implementations where a resistor is formed as a winding or maze-like element on the chip.

Therefore, one embodiment of the invention forms the LRB as an n-well resistor on the same die as the PMOS transistor 30. In one example of the n-well LRB, an n-region is formed on the chip. Next, a trench is formed in the n-region to separate the n-region into two portions, except that the trench does not completely reach the bottom of the n-region. The size of this remaining connection near the bottom of the n-region between the two portions of the n-region determines the resistance value of the LRB, and may generally be designed to be constant.

Another embodiment forms the LRB as an n-well with two n+ regions (source and drain) and a poly gate, much like a transistor, with the exception that an n-channel is formed in the n– region (the n+ regions are formed in and separated by the n– region in one example). The gate and the drain are tied together to prevent ESD problems. This embodiment provides more precise control over the value of the resistive element because a trench is not used and more controlled process, much like the process used to fabricate a transistor, allows this precision. This embodiment enables much finer control over resistance, including situations when additional devices added to the bus 14 may change termination impedance requirements.

In conclusion, an embodiment of the invention provides the pull-up circuit 16 that has substantially linear I–V characteristics. The pull-up circuit 16 can be used for a bus system 10, such as an ODBA-type bus system. The pull-up circuit 16 is simpler than other types of pull-up circuits, and hence, saves area on a chip. The LRB in the pull-up circuit 16 can be an n-well resistor formed on the same die as the PMOS transistor 30, thereby further contributing to the savings in chip area.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:

a single termination impedance element having a first terminal coupled to a node of a bus and having a second terminal; and a switching element having a first terminal coupleable to a voltage source, the switching element having a second terminal coupled to only the second terminal of the impedance element, the switching element having a third terminal to receive a signal to switch the switching element to couple the termination impedance element between the voltage source and the node if a voltage at the node is at a first level and to de-couple the termination impedance element between the voltage source and the node if the voltage at the node is at a second voltage lower than the first level, the termination impedance element and the switching element being formed on a same die, the termination impedance element having an impedance to substantially match a characteristic impedance of the bus and to bias the switching element to a substantially linear current-voltage (I–V) characteristic operating region.

2. The apparatus of claim 1 wherein the termination impedance element comprises an n-well resistor formed on the die.

3. The apparatus of claim 1 wherein the termination impedance comprises an n-well resistor formed on the die and having n+ regions formed in an n– region.

4. The apparatus of claim 1 wherein the bus comprises a Gunning Transceiver Logic-type bus.

5. The apparatus of claim 1 wherein the switching element comprises a P-channel metal oxide semiconductor (PMOS) transistor, and wherein the first, second, and third terminals of the switching element comprise, respectively, source, drain, and gate terminals of the PMOS transistor.

6. The apparatus of claim 1 wherein an impedance of the switching element in combination with the impedance of the termination impedance element match the characteristic impedance of the bus.

7. A system, comprising:

a bus;

a single termination impedance element having a first terminal coupled to a node of the bus and having a second terminal; and a switching element having a first terminal coupleable to a voltage source, the switching element having a second terminal coupled to only the second terminal of the impedance element, the switching element having a third terminal to receive a signal to switch the switching element to couple the termination impedance element between the voltage source and the node if a voltage at the node is at a first level and to de-couple the termination impedance element between the voltage source and the node if the voltage at the node is at a second voltage lower than the first level, the termination impedance element and the switching element being formed on the same die, the termination impedance element having an impedance to substantially match a characteristic impedance of the bus and to bias the switching element to a substantially linear current-voltage (I–V) characteristic operating region.

8. The system of claim 7 wherein the termination impedance element comprises an n-well resistor formed on the die.

9. The system of claim 7 wherein the termination impedance comprises an n-well resistor formed on the die and having n+ regions formed in an n– region.

10. The system of claim 7 wherein the bus comprises a Gunning Transceiver Logic-type bus.

11. The system of claim 7 wherein the switching element comprises a P-channel metal oxide semiconductor (PMOS) transistor, and wherein the first, second, and third terminals of the switching element comprise, respectively, source, drain, and gate terminals of the PMOS transistor.

12. The system of claim 7 wherein an impedance of the switching element in combination with the impedance of the termination impedance element match the characteristic impedance of the bus.

13. The system of claim 7, further comprising a pre-driver circuit having an output terminal coupled to the third terminal of the switching element to provide the signal to switch the switching element to couple or de-couple the termination impedance element.

14. The system of claim 7, further comprising:

a transistor having a first terminal coupled to the node, a second terminal coupled to ground, and a third terminal; and a pre-driver circuit having an output terminal coupled to the third terminal of the transistor, the pre-driver circuit being coupled to turn on the transistor to allow the voltage at the node to be at the second level, the pre-driver circuit being coupled to turn off the transistor to allow the voltage at the node to be at the first level.

15. A method, comprising:

providing an on-die termination impedance element for a bus;

if a voltage at a node of the bus is at a first level, coupling the termination impedance element between the node and a voltage source via a switching element formed on a same die as the termination impedance element;

if the voltage at the node is at a second level lower than the first level, de-coupling the termination impedance element between the node and a voltage source via the switching element; and using the termination impedance to bias the switching element to a substantially linear current-voltage (I–V) characteristic operating region.

16. The method of claim 15, further comprising forming the termination impedance element as an n-well resistor on the die.

17. The method of claim 15, further comprising forming the termination impedance element as an n-well resistor formed on the die and having n+ regions formed in an n– region.

18. The method of claim 15, further comprising substantially matching an impedance of the termination impedance element, in combination with an impedance of the switching element, to a characteristic impedance of the bus.

19. The method of claim 15 wherein the switching element comprises a P-channel metal oxide semiconductor (PMOS) transistor, and wherein using the termination impedance to bias the switching element to the substantially linear I–V characteristic operating region includes reducing a source-to-drain voltage of the PMOS transistor.

20. The method of claim 15, further comprising determining drive strength on the bus based on the substantially linear I–V characteristic operating region.

* * * * *